United States Patent
Liang et al.

(10) Patent No.: US 11,810,809 B2
(45) Date of Patent: Nov. 7, 2023

(54) METHOD FOR TRANSFERRING MICRO LIGHT EMITTING DIODES

(71) Applicant: MACROBLOCK, INC., Hsinchu (TW)

(72) Inventors: Shih-Sian Liang, Hsinchu (TW); Wei-Ming Tseng, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 301 days.

(21) Appl. No.: 17/213,753

(22) Filed: Mar. 26, 2021

(65) Prior Publication Data
US 2021/0305078 A1 Sep. 30, 2021

(30) Foreign Application Priority Data
Mar. 31, 2020 (TW) .................. 109110964

(51) Int. Cl.
| | |
|---|---|
| *H01L 21/683* | (2006.01) |
| *H01L 25/075* | (2006.01) |
| *H01L 33/50* | (2010.01) |
| *H01L 33/52* | (2010.01) |
| *H01L 33/62* | (2010.01) |

(52) U.S. Cl.
CPC ...... *H01L 21/6835* (2013.01); *H01L 25/0753* (2013.01); *H01L 33/50* (2013.01); *H01L 33/52* (2013.01); *H01L 33/62* (2013.01); *H01L 2221/68354* (2013.01); *H01L 2221/68368* (2013.01); *H01L 2933/005* (2013.01); *H01L 2933/0041* (2013.01); *H01L 2933/0066* (2013.01)

(58) Field of Classification Search
CPC .......... H01L 33/06; H01L 2221/68354; H01L 2221/68368; H01L 21/6835; H01L 25/0753; H01L 33/50; H01L 33/52; H01L 33/62; H01L 2933/0041; H01L 2933/005
See application file for complete search history.

(56) References Cited

U.S. PATENT DOCUMENTS

| | | | | |
|---|---|---|---|---|
| 2015/0115290 A1* | 4/2015 | Guenard | ................ | H01L 33/06 257/431 |
| 2018/0247922 A1* | 8/2018 | Robin | .................. | H01L 33/007 |

* cited by examiner

*Primary Examiner* — Ratisha Mehta

(57) ABSTRACT

A method for transferring micro light emitting diodes (micro-LEDs) includes forming a plurality of micro light emitting diode (micro-LED) chips having an epitaxial stacked layer and an electrode on a base; attaching the electrodes of the micro-LED chips to a temporary substrate and removing the base from the micro-LED chips; forming a light shielding layer on the temporary substrate; forming a light-transmissible packaging layer to cover the light shielding layer and the micro-LED chips; removing the temporary substrate to form a light emitting assembly; dividing the light emitting assembly to separate a plurality of pixels constituted by the micro-LEDs; and transferring the pixels to a permanent substrate.

20 Claims, 2 Drawing Sheets

METHOD FOR TRANSFERRING MICRO LIGHT EMITTING DIODES

CROSS-REFERENCE TO RELATED APPLICATION

This application claims priority of Taiwanese Invention Patent Application No. 109110964, filed on Mar. 31, 2020.

FIELD

The disclosure relates to a transferring method, and more particularly to a method for transferring micro light emitting diodes (micro-LEDs).

BACKGROUND

With higher demands for and wider applications of display and illumination, the need for LEDs with higher performance is on the rise. Micro-LEDs, which have dimensions less than 100 μm, are considered to be the next-generation display technology due to their excellent opto-electrical properties, such as self-emission, low power consumption, high brightness and long lifetime.

Pick and place transfer is one of the common methods for mass transferring micro-LEDs to a permanent substrate. In this method, one micro-LED is transferred from a wafer to the permanent substrate (such as a display panel) at one time, which is time-consuming. Therefore, those skilled in the art still endeavour to improve the efficiency of mass transferring the micro-LEDs.

SUMMARY

Therefore, an object of the disclosure is to provide a transferring method that can alleviate at least one of the drawbacks of the prior art.

According to the disclosure, the method for transferring micro-LEDs includes steps of:

forming a plurality of micro light emitting diode chips (micro-LED chips) on a base, each of the micro-LED chips having an epitaxial stacked layer connected to the base and an electrode formed on the epitaxial stacked layer opposite to the base, the micro-LED chips being separated from one another by gap regions;

attaching the electrodes of the micro-LED chips to a temporary substrate and removing the base from the micro-LED chips;

forming a light shielding layer on the temporary substrate to fill the gap regions so that the micro-LED chips are separated from one another by the light shielding layer;

forming a light-transmissible packaging layer to cover the light shielding layer and the micro-LED chips so as to obtain a plurality of micro-LEDs, each of the micro-LEDs including a corresponding one of the micro-LED chips and a portion of the light-transmissible packaging layer formed on the corresponding one of the micro-LED chips, the micro-LEDs constituting a plurality of pixels, each of the pixels including at least two micro-LEDs emitting different colors of light;

removing the temporary substrate to form a light emitting assembly;

dividing the light emitting assembly so as to separate the pixels from one another; and transferring the pixels to a permanent substrate.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
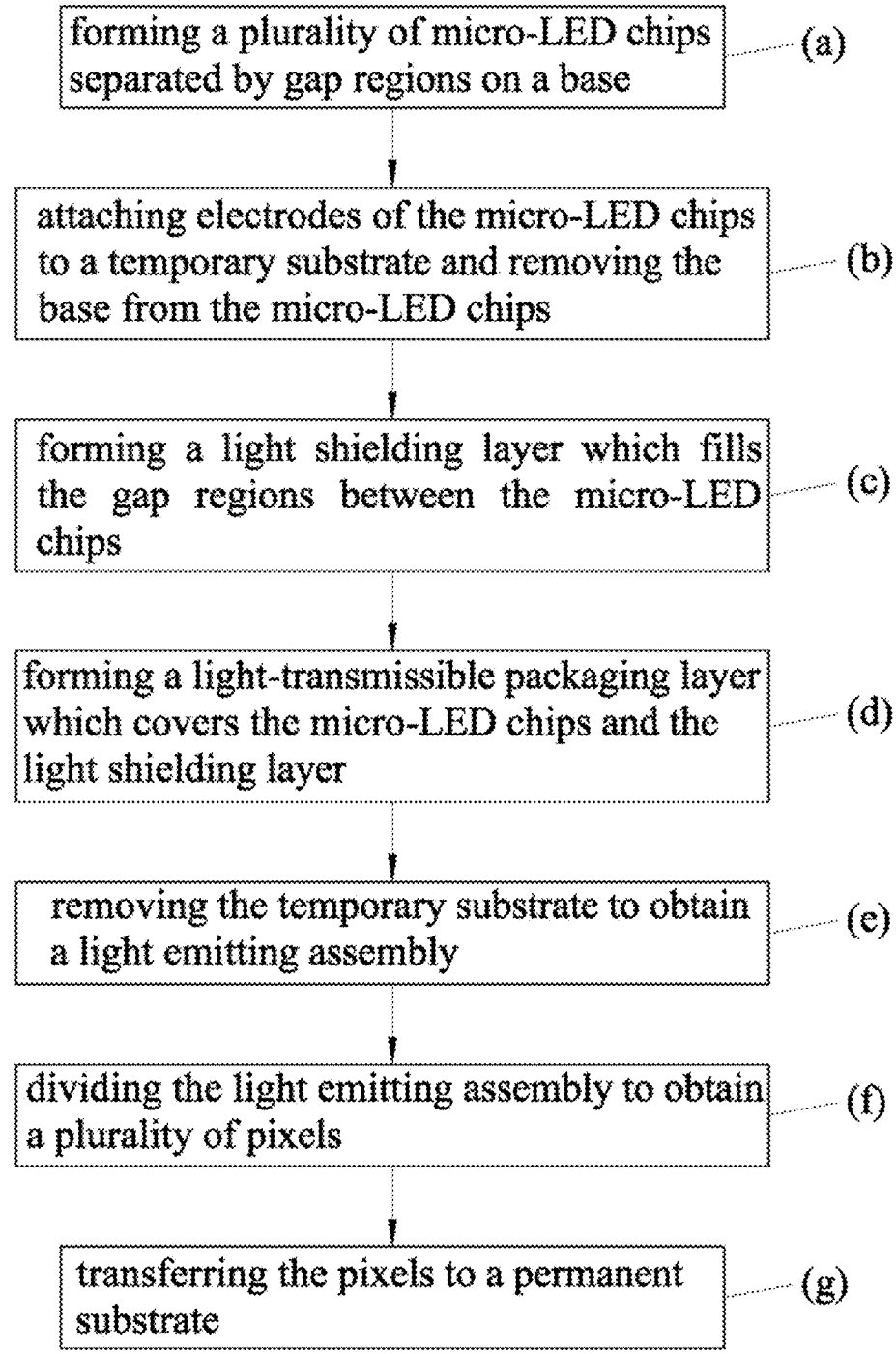
FIG. 1 is a flow chart illustrating steps of a method for transferring micro-LEDs according to the disclosure.

Before the disclosure is described in greater detail, it should be rioted that where considered appropriate, reference numerals or terminal portions of reference numerals have been repeated among the figures to indicate corresponding or analogous elements, which may optionally have similar characteristics.

Figure 2:
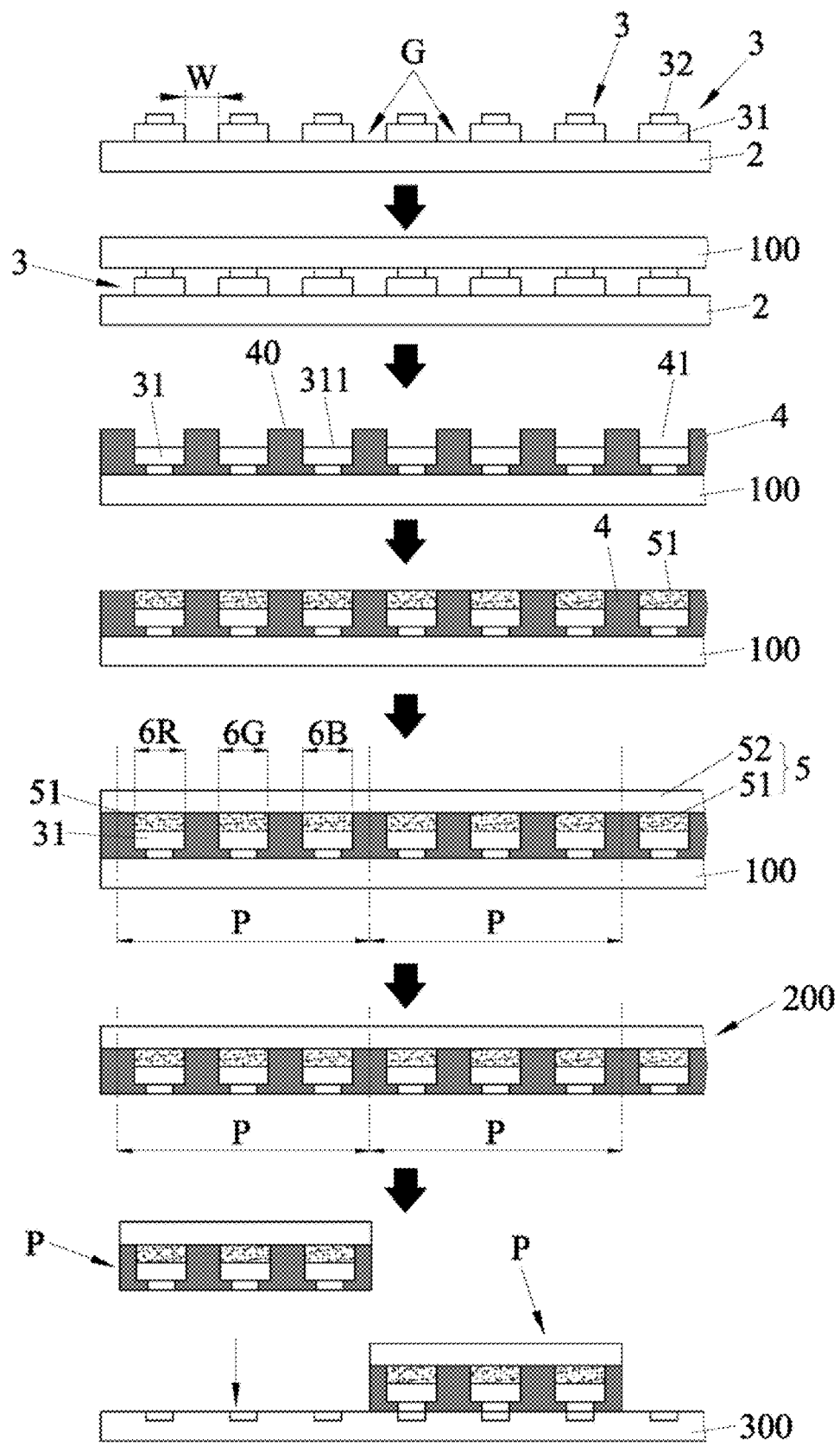
FIG. 2 shows schematic views of different steps of the method for transferring the micro-LEDs.

Referring to FIGS. 1 and 2, a method for transferring micro-LEDs is illustrated. The method includes steps (a) to (g).

In step (a), a plurality of micro-LED chips 3 are formed on a base 2. Each of the micro-LED chips 3 has an epitaxial stacked layer 31 connected to the base 2, and an electrode 32 formed on the epitaxial stacked layer 31 opposite to the base 2. In this embodiment, the base 2 is a wafer substrate for growing the epitaxial stacked layer 31, such as a sapphire substrate or a silicon substrate. An epitaxial material layer is grown on the base 2, and the electrodes 32 are subsequently formed on the epitaxial material layer. After forming the epitaxial material layer and the electrodes 32, the epitaxial material layer is divided into the epitaxial stacked layers 31 with a plurality of gap regions (G) separating the micro-LED chips 3 that are arranged in arrays. The micro-LED chips 3 may emit the same color of light or different colors of light. Since the material used for growing the epitaxial stacked layer 31 and the process for manufacturing the micro-LED chips 3 are well known to a skilled artisan, related descriptions thereof are not illustrated hereinafter for the sake of brevity.

Each of the gap regions (G) are disposed between adjacent two of the micro-LED chips 3, and has a width (W) ranging from 0.1 to 1 mm. In one embodiment, the width (W) of each of the gap regions (G) ranges from 0.1 to 0.5 mm. The electrodes 32 formed on the epitaxial stacked layers 31 are used for electrical connection with external elements. The epitaxial stacked layer 31 of each of the micro-LED chips 3 has a thickness approximately being equal to or smaller than 10 μm, and has a dimension approximately being equal to or smaller than 100 μm×100 μm (e.g., length by width). In some embodiments, the length, width and thickness of the epitaxial stacked layer 31 of each of the micro-LED chips 3 may be adjusted according to practical requirements.

Next, in step (b), the electrodes 32 of the micro-LED chips 3 are attached to a temporary substrate 100, and the base 2 is removed from the micro-LED chips 3. To be specific, the temporary substrate 100 may be used to temporarily carry the micro-LED chips 3 when the base 2 is removed therefrom. The temporary substrate 100 may be made of glass or a polymer material (such as polyimide or the like). The attachment of the micro-LED chips 3 to the temporary substrate 100 may be conducted by thermal compression bonding or other suitable techniques. The removal of the base 2 from the micro-LED chips 3 may be conducted by laser lift-off or other suitable techniques. It should be noted that since the laser types and the power parameters of the laser lift-off process are well known in this technical field, a skilled artisan may adjust them based on the material of the base 2 to be removed, and thus, further details thereof are not described hereinafter for the sake of brevity.

Next, in step (c), a light shielding layer 4 is formed on the temporary substrate 100 to fill the gap regions (G) so that the micro-LED chips 3 are separated from one another by the light shielding layer 4. In some embodiments, the temporary substrate 100 and the micro-LED chips 3 may be flipped over, followed by applying the light shielding layer 4. The formation of the light shielding layer 4 may be conducted by screen printing using an opaque material filled in the gap regions (G) and curing the opaque material. The opaque material may be made of a block resin to form a black matrix (BM), or may be made of other suitable materials.

The epitaxial stacked layer 31 of each of the micro-LED chips 3 has a surface 311 opposite to the temporary substrate 100, and the light shielding layer 4 has a surface 40 opposite to the temporary substrate 100. In the case where the micro-LED chips 3 emit different colors of light, the surface 40 of the light shielding layer 4 may be flush with the surface 311 of the epitaxial stacked layer 31 of each of the micro-LED chips 3. In the case where the micro-LED chips 3 emit the same color of light (for example, blue light), the light shielding layer 4 is formed to extend over the micro-LED chips 3 to obtain a plurality of grooves 41 respectively located on the micro-LED chips 3. That is, the surface 40 of the light shielding layer 4 is located at a higher level than that of the surface 311 of the epitaxial stacked layer 31 of each of the micro-LED chips 3. The grooves 41 are used for forming a color conversion layer so as to transform the color of lights emitted from the micro-LED chips 3. The formation of the color conversion layer will be described in the next step.

Next, in step (d), a light-transmissible packaging layer 5 is formed to cover the light shielding layer 4 and the micro-LED chips 3 so as to obtain a plurality of micro-LEDs.

To be specific, a color conversion layer 51 is formed by applying a solution containing quantum dots into the grooves 41 and then curing the solution. In this embodiment, the solution may be applied into the grooves 41 by inkjet printing. Then, a resin material may be applied by screen printing or molded injection on the light shielding layer 4 and the color conversion layer 51, and is then cured to form the transparent protective layer 52. The resin material may be a transparent adhesive, such as epoxy, silicone, polyimide, or other suitable materials. The color conversion layer 51 and the transparent protective layer 52 together form the light-transmissible packaging layer 5.

Each of the micro-LEDs includes a corresponding one of the micro-LED chips 3 and a portion of the light-transmissible packaging layer 5 formed on the corresponding one of the micro-LED chips 3. The wavelength of the light emitted from each of the micro-LED chips 3 is transformed by the color conversion layer 51 into red, green, blue, or other colors according to practical requirements. As shown in FIG. 2, the micro-LEDs emitting different colors of light are respectively denoted as 6R, 6G and 6B. It should be noted that in the case of the micro-LED chips 3 emitting different colors of light, the light-transmissible packaging layer 5 may only include the transparent protective layer 52 without the color conversion layer 51.

Afterwards, a plurality of pixels (P) may be defined. Each of the pixels (P) includes at least two of the micro-LEDs emitting different colors of light. The definition of pixels (P) is based on a display package structure to be subsequently formed with a permanent substrate 300. For example, in order to form the display package structure having multiple groups of display pixel units which are arranged in a repetitive form and each of which including three micro-LEDs (6R, 6G, 6B) emitting red, green and blue lights, respectively, in a linear arrangement along an x-direction, each of the pixels (P) is defined to include three micro-LEDs (6R, 6G, 6B) emitting red, green and blue lights in such order.

Next, in step (e), the temporary substrate 100 is removed to form a light emitting assembly 200. To be specific, the temporary substrate 100 may be removed by laser ablation, such that the electrodes 32 of the micro-LED chips 3 are exposed.

Next, in step (f), the light emitting assembly 200 is divided along multiple imaginary cutting lines passing through the light shielding layer 4 and the light-transmissible packaging layer 5 so as to separate the pixels (P) from one another. Since the micro-LED chips 3 are arranged relatively close to one another, mechanical cutting may damage the micro-LED chips 3. In this embodiment, the division of the light emitting assembly 200 is conducted by at least one of dry etching, wet etching and photo etching (e.g., laser cutting) or other suitable techniques to minimize damage. In one embodiment, the division of the light emitting assembly 200 may be conducted by a combination of wet etching and photo etching to achieve an optimal dividing efficiency. It should be noted that other combinations of dividing techniques may be applied according to practical requirements.

Finally, in step (g), the pixels (P) are transferred to the permanent substrate 300. The transfer of the pixels (P) to the permanent substrate 300 may be conducted using a robotic arm. Then, the pixels (P) transferred to the permanent substrate 300 are electrically connected to the wiring on the permanent substrate 300.

To sum up, by virtue of the method of this disclosure, arrays of the micro-LED chips 3 separated from one another by gap regions (G) form the pixels (P) including at least two micro-LEDs emitting different colors of light, and the pixels (P) can then be transferred to the permanent substrate 300. In this way, the transfer of the micro-LEDs can be speed up compared to conventional transferring methods which transfer one micro-LED at a time. Moreover, the packaging time of the micro-LEDs can also be reduced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method for transferring micro light emitting diodes (micro-LEDs), comprising:
    forming a plurality of micro fight emitting diode chips on a base, each of the micro light emitting diode chips having an epitaxial stacked layer connected to the base and an electrode formed on the epitaxial stacked layer opposite to the base, the micro light emitting diode chips being separated from one another by gap regions;
    attaching the electrodes of the micro light emitting diode chips to a temporary substrate and removing the base from the micro light emitting diode chips; forming a light shielding layer on the temporary substrate to fill the gap regions so that the micro light emitting diode chips are separated from one another by the light shielding layer;
    forming a light-transmissible packaging layer to cover the light shielding layer and the micro light emitting diode chips so as to obtain a plurality of micro-LEDs, each of the micro-LEDs including a corresponding one of the micro light emitting diode chips and a portion of the light-transmissible packaging layer formed on the corresponding one of the micro light emitting diode chips, the micro-LEDs constituting a plurality of pixels, each of the pixels including at least two of the micro-LEDs emitting different colors of light;
    removing the temporary substrate to form a light emitting assembly; dividing the light emitting assembly so as to separate the pixels from one another; and
    transferring the pixels to a permanent substrate.

2. The method of claim 1, wherein each of the gap regions disposed between adjacent two of the micro light emitting diode chips has a width ranging from 0.1 to 1 mm.

3. The method of claim 2, wherein the width of each of the gap regions ranges from 0.1 to 0.5 mm.

4. The method of claim 1, wherein the light shielding layer has a surface opposite to the temporary substrate, and the epitaxial stacked layer has a surface opposite to the temporary substrate, the surface of the light, shielding layer being flush with the surface of the epitaxial stacked layer of each of the micro light emitting diode chips.

5. The method of claim 1, wherein the steps of forming the light shielding layer and the light-transmissible packaging layer include forming the light shielding layer extending over the micro light emitting diode chips so as to form a plurality of grooves respectively located on the micro light emitting diode chips, forming a color conversion layer in the grooves, and forming a transparent protective layer covering the light shielding layer and the color conversion layer, the light-transmissible packaging layer being constituted by the color conversion layer and the transparent protective layer.

6. The method of claim 5, wherein the step of forming the color conversion layer is conducted by applying a solution containing quantum dots into the grooves and curing the solution.

7. The method of claim 6, wherein the solution is applied into the grooves by inkjet printing.

8. The method of claim 5, wherein the step of forming the transparent protective layer is conducted by screen printing or molded injecting a resin material on the light shielding layer and the color conversion layer, and curing the resin material.

9. The method of claim 1, wherein the step of dividing the light emitting assembly is conducted by at least one of dry etching, wet etching and photo etching.

10. The method of claim 9, wherein the step of dividing the light emitting assembly is conducted by wet etching and photo etching.

11. The method of claim 1, wherein the step of forming the light shielding layer is conducted by screen printing an opaque material in the gap regions and then curing the opaque material.

12. The method of claim 1, wherein the micro light emitting diode chips emit different colors of light.

13. The method of claim 1, wherein the step of transferring the pixels to the permanent substrate is conducted using a robotic arm.

14. A method for transferring micro light emitting diodes (micro-LEDs), comprising:
    forming a plurality of micro light emitting diode chips on a base, each of the micro light emitting diode chips having an epitaxial stacked layer connected to the base and an electrode formed on the epitaxial stacked layer opposite to the base, the micro light emitting diode chips being separated from one another by gap regions and emitting a same color of light;
    attaching the electrodes of the micro light emitting diode chips to a temporary substrate and removing the base from the micro light emitting diode chips;
    forming a light shielding layer on the temporary substrate to fill the gap regions so that the micro light emitting diode chips are separated from one another by the light shielding layer, the light shielding layer being extended over the micro light emitting diode chips so as to form a plurality of grooves respectively located on the micro light emitting diode chips;
    forming a light-transmissible packaging layer to cover the light shielding layer and the micro light emitting diode chips so as to obtain a plurality of micro-LEDs, the light-transmissible packaging layer being constituted by a color conversion layer formed in the grooves, and a transparent protective layer covering the light shielding layer and the color conversion layer, each of the micro-LEDs including a corresponding one of the micro light emitting diode chips and a portion of the light-transmissible packaging layer formed on the corresponding one of the micro light emitting diode chips, the micro-LEDs constituting a plurality of pixels, each of the pixels including at least two of the micro-LEDs emitting different colors of light;
    removing the temporary substrate to form a light emitting assembly;
    dividing the light emitting assembly so as to separate the pixels from one another; and
    transferring the pixels to a permanent substrate.

15. The method of claim 14, wherein each of the gap regions disposed between adjacent two of the micro light emitting diode chips has a width ranging from 0.1 mm to 1 mm.

16. The method of claim 14, wherein the step of forming the color conversion layer is conducted by applying a solution containing quantum dots into the grooves and curing the solution.

17. The method of claim 16, wherein the solution is applied into the grooves by inkjet printing.

18. The method of claim 14, wherein the step of forming the transparent protective layer is conducted by screen printing or molded injecting a resin material on the light shielding layer and the color conversion layer, and curing the resin material.

19. The method of claim 14, wherein the step of forming the light shielding layer is conducted by screen printing an opaque material in the gap regions and then curing the opaque material.

20. The method of claim 14, wherein the step of transferring the pixels to the permanent substrate is conducted using a robotic arm.

\* \* \* \* \*